(12) United States Patent
Takamura et al.

(10) Patent No.: US 9,041,194 B2
(45) Date of Patent: May 26, 2015

(54) PRESSURE UNIT

(75) Inventors: Noritoshi Takamura, Kanagawa (JP);
Michiya Masuda, Kanagawa (JP);
Ichiro Sasuga, Kanagawa (JP);
Nobuharu Kato, Nagano (JP); Kengo Tsurugai, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 11 days.

(21) Appl. No.: 14/004,496

(22) PCT Filed: Mar. 15, 2012

(86) PCT No.: PCT/JP2012/056773
§ 371 (c)(1),
(2), (4) Date: Sep. 11, 2013

(87) PCT Pub. No.: WO2012/124783
PCT Pub. Date: Sep. 20, 2012

(65) Prior Publication Data
US 2014/0001630 A1 Jan. 2, 2014

(30) Foreign Application Priority Data
Mar. 17, 2011 (JP) ................. 2011-059711

(51) Int. Cl.
*H01L 23/34* (2006.01)
*H01L 23/40* (2006.01)
*H01L 23/433* (2006.01)
*H01L 23/473* (2006.01)
*H01L 25/11* (2006.01)
(Continued)

(52) U.S. Cl.
CPC ............. *H01L 23/40* (2013.01); *H01L 23/4012* (2013.01); *H01L 23/433* (2013.01); *H01L 23/473* (2013.01); *H01L 25/112* (2013.01); *H02M 7/003* (2013.01); *H01L 2924/0002* (2013.01); *H02M 2001/327* (2013.01)

(58) Field of Classification Search
USPC .......................... 257/706, 707, 714, 718, 719
See application file for complete search history.

(56) References Cited

U.S. PATENT DOCUMENTS 3,864,607 A    2/1975  Phillips
6,181,007 B1 * 1/2001  Yamazaki et al. ............ 257/718
(Continued)

FOREIGN PATENT DOCUMENTS

JP    10-107194 A    4/1998
JP    11-215804 A    8/1999
(Continued)

OTHER PUBLICATIONS

International Search Report dated Jun. 19, 2012, issued for PCT/JP2012/056773.
(Continued)

*Primary Examiner* — S. V. Clark
(74) *Attorney, Agent, or Firm* — Locke Lord LLP

(57) ABSTRACT

The pressure unit includes a spring member that is formed into a coil form obtained by winding a wire rod and that has a periodically changing pitch angle and a housing member to which end portions of the spring member are attached, and the pressure unit pressurizes a semiconductor stacked unit obtained by alternately stacking a semiconductor element module and a cooling tube that makes contact with the semiconductor element module and cools the semiconductor element module.

8 Claims, 6 Drawing Sheets

(51) Int. Cl.
*H02M 7/00* (2006.01)
*H02M 1/32* (2007.01)

(56) References Cited

U.S. PATENT DOCUMENTS

| | | | |
|---|---|---|---|
| 7,965,508 B2 * | 6/2011 | Yamamoto et al. | ........... 361/699 |
| 2005/0133210 A1 | 6/2005 | Inagaki et al. | |
| 2006/0007660 A1 | 1/2006 | Yatskov et al. | |
| 2006/0146500 A1 | 7/2006 | Yatskov | |
| 2008/0239663 A1 * | 10/2008 | Yamamoto et al. | ........... 361/691 |
| 2009/0008061 A1 | 1/2009 | Inagaki et al. | |
| 2010/0190049 A1 | 7/2010 | Kawase et al. | |

FOREIGN PATENT DOCUMENTS

| | | |
|---|---|---|
| JP | 2001-167745 A | 6/2001 |
| JP | 2001-304336 A | 10/2001 |
| JP | 2003-060161 A | 2/2003 |
| JP | 2005-228877 A | 8/2005 |
| JP | 2007-166820 A | 6/2007 |
| JP | 2009-130964 A | 6/2009 |

OTHER PUBLICATIONS

Supplementary European Search Report dated Feb. 27, 2015, issued for the European patent application No. 12758031.4.

* cited by examiner

DEFLECTION AMOUNT

PRESSURE UNIT

FIELD

The present invention relates to a pressure unit that is applied to a power conversion device constituted by using a semiconductor element and pressurizes the semiconductor element and a cooling tube so as to hold them close together.

BACKGROUND

Known have been a DC-to-DC converter, an inverter, and the like as power conversion devices (power modules) that generate driving power for electric vehicles (EVs) or hybrid electric vehicles (HEVs). In these power conversion devices, a large driving current flows to a semiconductor module including a semiconductor element such as an insulated gate bipolar transistor (IGBT) at the time of driving in some cases. That is, it is important to cool the semiconductor module at the time of driving and suppress heat generation.

Conventionally, in order to suppress heat generation of the semiconductor module, the following cooling configuration (see Patent Literature 1, for example) has been known. In the cooling configuration, the semiconductor module and a cooling member are alternately stacked. Then, the semiconductor module and the cooling member are pressurized by a pressure unit formed by a disc spring from one side in the stacking direction thereof so as to hold them close together, and are cooled. The disc spring has a deflection region on which load is nearly constant so as to absorb the difference in dimension due to manufacturing variations (dimensional tolerances in the stacking direction) of the power conversion device (see Patent Literature 2, for example).

CITATION LIST

Patent Literature

Patent Literature 1: Japanese Patent Application Laid-open No. 10-107194
Patent Literature 2: Japanese Patent Application Laid-open No. 2001-167745

SUMMARY

Technical Problem

The disc spring extends symmetrically in the radial direction. When a sufficient space for the pressure unit cannot be ensured, a plurality of disc springs having small diameters are required to be used. This causes a problem that the configuration is complicated.

In order to solve the problem and configure the pressure unit that can be reduced in size, it is considered that a coil spring having a regular pitch is used, for example. When the coil spring having the regular pitch is used as a normal compression spring, the load changes depending on a deflection amount of the spring because the coil spring has a linear load-deflection characteristic. As a result, the coil spring cannot absorb manufacturing variations on the power conversion device sufficiently. This causes a risk that a pressing force is too small and cooling is insufficient, or the pressing force is too large and the semiconductor element and the cooling tube are deteriorated.

The present invention has been made in view of the above-mentioned circumstances and an object thereof is to provide a pressure unit that can absorb dimensional variations of a pressing target at the time of manufacturing and can be reduced in size with a simple configuration.

Solution to Problem

To solve the problem described above and achieve the object, a pressure unit according to the present invention is configured to pressurize a semiconductor stacked unit obtained by alternately stacking a semiconductor element module and a cooling tube that makes contact with the semiconductor element module and cools the semiconductor element module, and the pressure unit includes: a spring member that is formed into a coil form obtained by winding a wire rod and that has a periodically changing pitch angle; and a housing member to which the spring member is attached.

Moreover, in the above-described pressure unit according to the present invention, the spring member has hooks on both end portions, and the housing member has protrusions that project from a surface on which the spring member is placed and are capable of locking the hooks.

Moreover, in the above-described pressure unit according to the present invention, both end portions of the spring member extend in a direction orthogonal to a center line, and the housing member has hole portions into which both end portions of the spring member are capable of being inserted.

Moreover, in the above-described pressure unit according to the present invention, the housing member has a rib that projects from a surface on which the spring member is placed and has a width corresponding to a pitch of a predetermined portion of the spring member.

Moreover, in the above-described pressure unit according to the present invention, the housing member has a groove portion that accommodates a part of the spring member.

Moreover, in the above-described pressure unit according to the present invention further includes a mesh spring that is formed by weaving a steal wire into a mesh form and sandwiches and holds the spring member together with the housing member.

Moreover, in the above-described pressure unit according to the present invention, the spring member is provided in plurality, and the spring members are attached to the housing member such that center lines of the spring members are parallel with one another.

Moreover, in the above-described pressure unit according to the present invention, a non-woven fabric having heat resistance to a predetermined temperature is interposed between the spring member and the housing member.

Advantageous Effects of Invention

In the present invention, used is a canted spring member that is formed into a coil form obtained by winding a wire rod and that has a periodically changing pitch angle as an angle formed by the center line of the wire rod with respect to a plane orthogonal to the center line of the spring member. The spring member has a deflection range in which load is substantially constant and a space of the spring member in the direction (short-side direction) orthogonal to the center line thereof can be saved. With this, the spring member can absorb dimensional variations of a pressing target at the time of manufacturing and can be reduced in size with a simple configuration.

DESCRIPTION OF EMBODIMENT

The following describes a mode for carrying out the invention (hereinafter, referred to as an "embodiment") with reference to the accompanying drawings.

Figure 1:
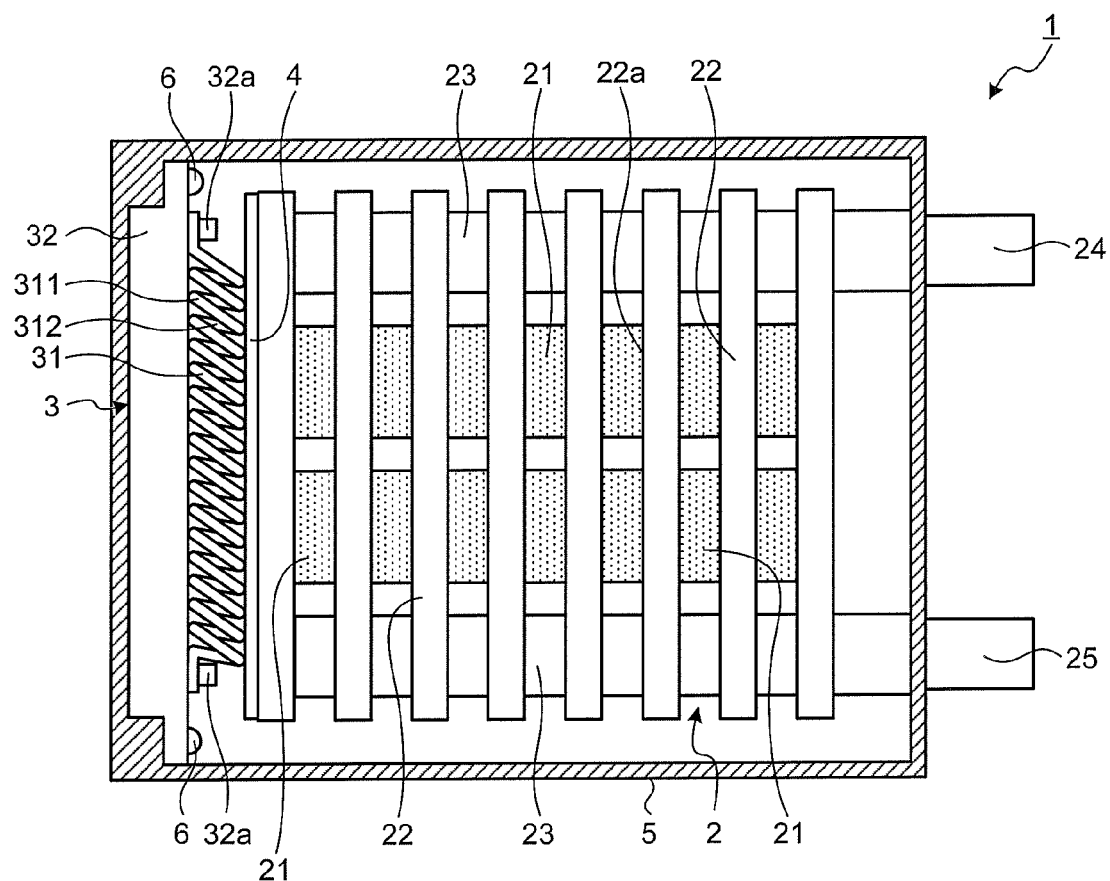
FIG. 1 is a view illustrating a configuration of main parts of a power conversion device on which a pressure unit according to an embodiment of the invention is mounted.

FIG. 1 is a view illustrating a configuration of main parts of a power conversion device on which a pressure unit according to an embodiment of the invention is mounted. A power conversion device 1 as illustrated in FIG. 1 is a device for generating a driving current that is made to flow to driving motors for electric vehicles, for example.

The power conversion device 1 includes a semiconductor stacked unit 2, a pressure unit 3, a flat plate-like abutting plate 4, and a housing 5. The semiconductor stacked unit 2 includes semiconductor elements. The pressure unit 3 pressurizes the semiconductor stacked unit 2 from one side surface. The abutting plate 4 is interposed between the semiconductor stacked unit 2 and the pressure unit 3. The housing 5 accommodates the semiconductor stacked unit 2, the pressure unit 3, and the abutting plate 4. The power conversion device 1 includes a control circuit for controlling semiconductor modules 21, and the like, in addition to the constituent components as illustrated in FIG. 1.

The semiconductor stacked unit 2 has a configuration in which the semiconductor modules 21 and cooling tubes 22 are stacked alternately. In the case of the configuration as illustrated in FIG. 1, two semiconductor modules 21 are arranged between the adjacent cooling tubes 22 along the stacking direction.

Each semiconductor module 21 is formed integrally by arranging an IGBT element for power supply and a flywheel diode element provided for rotating a motor smoothly between a pair of heat dissipation plates and sealing them by a resin such that the pair of heat dissipation plates are exposed.

Each cooling tube 22 is a flattened tube having a refrigerant flow path therein. A natural refrigerant such as water and ammonia, water mixed with an ethylene glycol-based anti-freeze solution, a carbon fluoride-based refrigerant such as Fluorinert, a fluorocarbon-based refrigerant such as HCFC123 and HFC134a, an alcohol-based refrigerant such as methanol and alcohol, or a ketone-based refrigerant such as acetone is distributed in the refrigerant flow path.

The plurality of cooling tubes 22 are coupled to one another through coupling pipes 23 extending along the stacking direction of the semiconductor stacked unit 2. A refrigerant inlet port 24 and a refrigerant outlet port 25 are provided at the end portions of the coupling pipes 23. The refrigerant inlet port 24 and the refrigerant outlet port 25 are connected to the cooling tubes 22 arranged on the corresponding end portions of the coupling pipes 23. The cooling tubes 22, the coupling pipes 23, the refrigerant inlet port 24, and the refrigerant outlet port 25 are formed by using aluminum, for example.

Main surfaces 22a of the cooling tubes 22 are pressed firmly to the heat dissipation plates of the semiconductor modules 21 by a pressure force from the pressure unit 3. This makes it possible to perform heat exchange between the semiconductor modules 21 and the cooling tubes 22.

Figure 2:
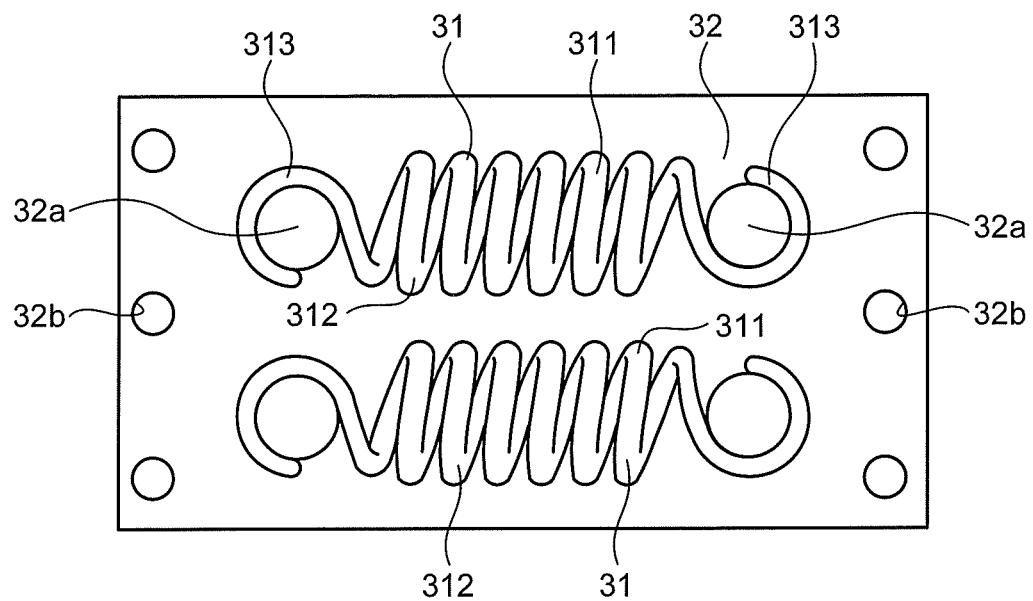
FIG. 2 is a view illustrating a configuration of the pressure unit according to the embodiment of the invention.

FIG. 2 is a side view illustrating a configuration of the pressure unit 3. The pressure unit 3 as illustrated in FIG. 2 includes coiled spring members 31 and a housing member 32. The end portions of the spring members 31 are attached and fixed to the housing member 32. The pressure unit 3 is fixed to the housing 5 with screws 6.

Each spring member 31 is a canted coil spring of which pitch angle formed by a center line of a wire rod with respect to a plane orthogonal to the center line of the spring member 31 is not constant and in which portions having two different pitch angles are alternately formed periodically. To be more specific, each spring member 31 includes first wound portions 311 and second wound portions 312 having different pitch angles and spring hook portions 313. The spring hook portions 313 are provided at both ends of the spring member 31 and are attached to the housing member 32.

Figure 3:
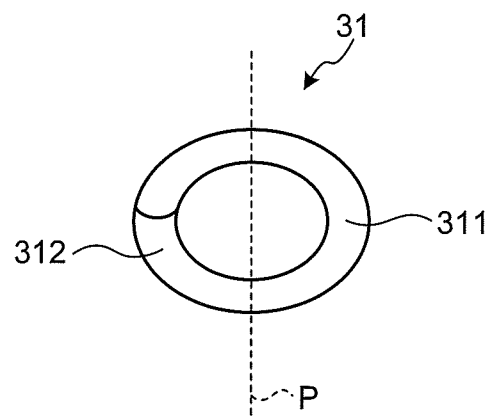
FIG. 3 is a view illustrating a configuration of a spring member constituting a part of the pressure unit according to the embodiment of the invention.

FIG. 3 is a view illustrating a configuration of the spring member 31. As illustrated in FIG. 3, the first wound portion 311 and the second wound portion 312 are located at the different sides of a boundary surface when setting, as the boundary surface, a plane P dividing the spring member 31 in two such that the center line of the spring member 31 passes through the plane P. That is, an outer shape of the spring member 31 when seen from the direction in which the center line extends is circular or oval. In the case of FIG. 3, the spring member 31 has an oval shape. For example, the spring member 31 is formed by using a spring steel such as chromium silicon steel.

Figure 4:
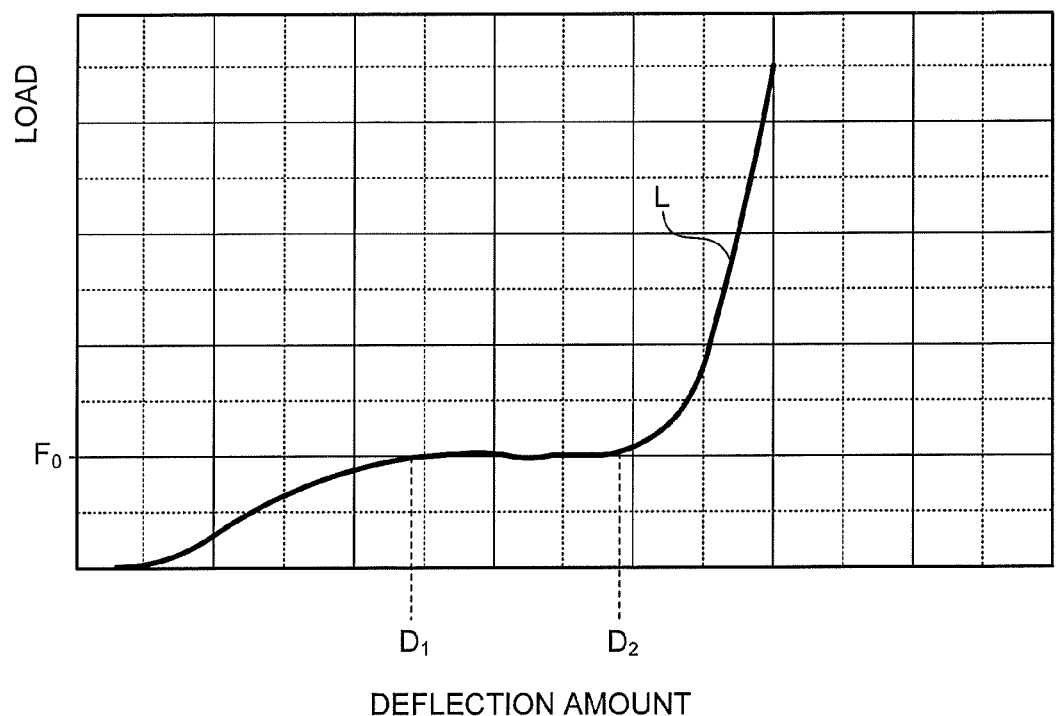
FIG. 4 is a graph illustrating a load-deflection characteristic of the spring member constituting a part of the pressure unit according to the embodiment of the invention.

FIG. 4 is a graph illustrating a load-deflection characteristic of the spring member 31. On a load-deflection characteristic curve L as illustrated in FIG. 4, a horizontal axis indicates a deflection amount and a vertical axis indicates a load. As illustrated in FIG. 4, the load of the spring member 31 is substantially equal to $F_0$ when the deflection amount thereof is in a range of $D_1$ to $D_2$. The spring member 31 having such a load-deflection characteristic takes a substantially constant load when the deflection amount is in a range of $D_1$ to $D_2$. That is to say, a stable load can be obtained in this range of the deflection amount.

Next, the housing member 32 is described with reference to FIG. 2. The housing member 32 includes boss portions 32a for locking the spring hook portions 313 onto a surface on which the spring members 31 are placed. Furthermore, a plurality of screw holes 32b with which screws for fixing the housing member 32 to the housing 5 can be engaged threadably are provided at the end portions of the housing member 32. The housing member 32 is made of a resin, for example.

In the above-described embodiment of the invention, used is the canted spring member that is formed into a coil form obtained by winding a wire rod and that has a periodically changing pitch angle as the angle formed by the center line of the wire rod with respect to the plane orthogonal to the center line of the spring member. The spring member has a deflection range in which the load is substantially constant and can be reduced in a space in the direction (short-side direction) orthogonal to the center line of the spring member. The spring member can absorb dimensional variations of the pressing target at the time of manufacturing and can press it with the constant load all the time even when it is deformed with thermal expansion. In addition, the spring member can be reduced in size with the simple configuration. This makes it possible to provide the power conversion device that can maintain stable cooling property all the time and can be reduced in size appropriately.

Furthermore, according to the embodiment, the spring member is attached and fixed to the housing member by providing hooks on the end portions of the spring member. This prevents falling of the spring member due to the gravity force if the housing member is attached to the housing when the power conversion device is assembled. This makes it possible to improve assembling easiness of the power conversion device dramatically. Note that the hook shape is not limited to the above-mentioned shape and the hook surface can be changed appropriately. In this case, it is needless to say that the configuration of the housing member onto which the hooks are locked is changed.

Figure 5:
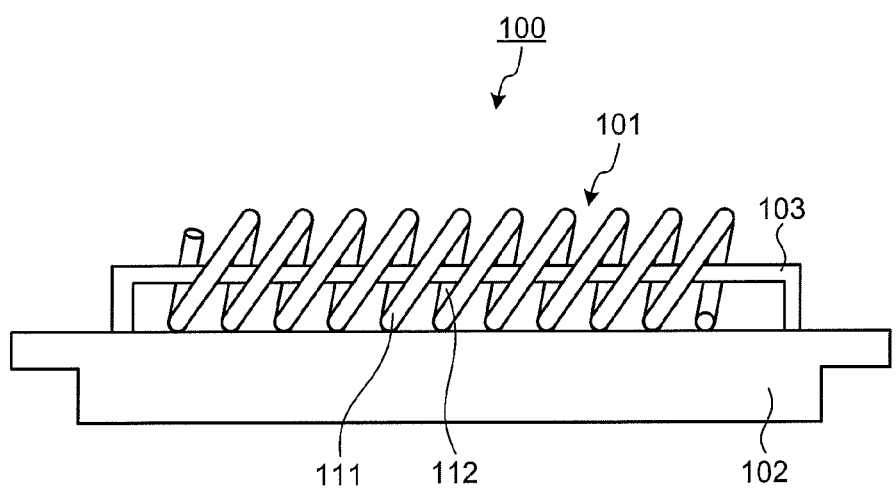
FIG. 5 is a view illustrating a configuration of main parts of a pressure unit according to a first modification of the embodiment of the invention.

FIG. 5 is a view illustrating a configuration of main parts of a pressure unit according to a first modification of the embodiment. A pressure unit 100 as illustrated in FIG. 5 includes a spring member 101, a housing member 102, and a fixing member 103 for attaching the spring member 101 to the housing member 102. The spring member 101 is a canted coil spring that is the same as the spring member 31 and includes first wound portions 111 and second wound portions 112. The fixing member 103 penetrates through the spring member 101 along the center line of the spring member 101 and both ends of the fixing member 103 are fixed to the housing member 102.

Figure 6:
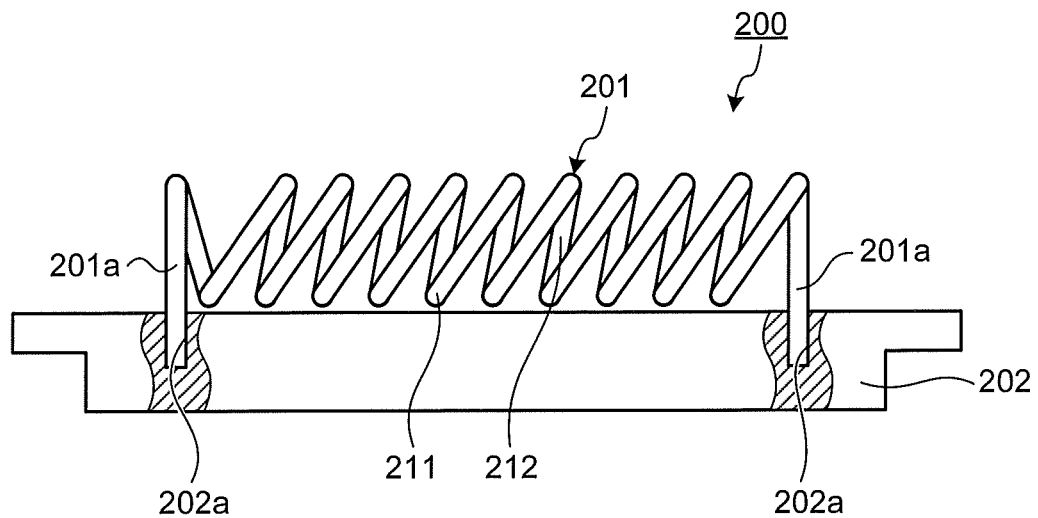
FIG. 6 is a view illustrating a configuration of main parts of a pressure unit according to a second modification of the embodiment of the invention.

FIG. 6 is a view illustrating a configuration of a pressure unit according to a second modification of the embodiment. A pressure unit 200 as illustrated in FIG. 6 includes a spring member 201 and a housing member 202. The spring member 201 is a canted coil spring that is the same as the spring member 31 and includes first wound portions 211 and second wound portions 212. End portions 201a at both sides of the spring member 201 extend linearly in the direction orthogonal to the center line of the spring member 201. The housing member 202 has hole portions 202a bored on the surface on which the spring member 201 is placed. The spring member 201 is attached to the housing member 202 by inserting the end portions 201a into the hole portions 202a of the spring member 201.

Figure 7:
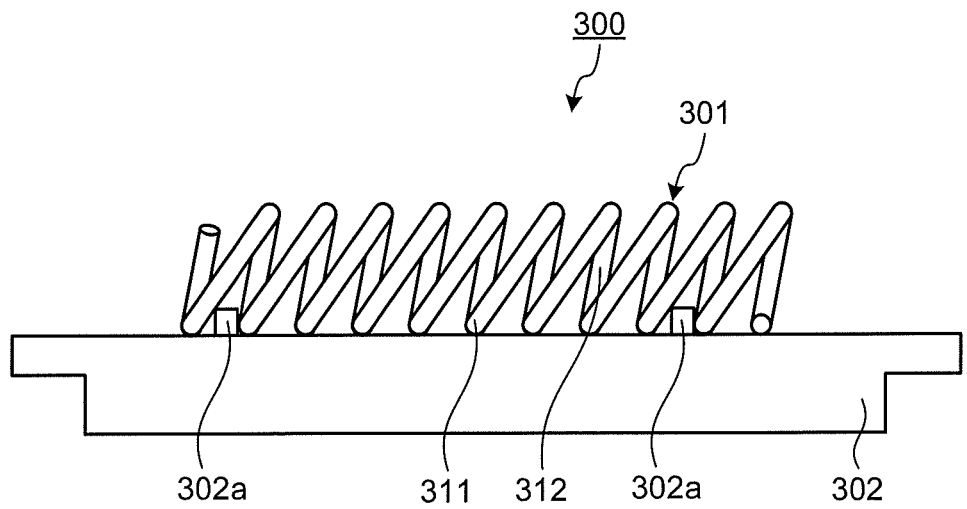
FIG. 7 is a view illustrating a configuration of main parts of a pressure unit according to a third modification of the embodiment of the invention.

FIG. 7 is a view illustrating a configuration of a pressure unit according to a third modification of the embodiment. A pressure unit 300 as illustrated in FIG. 7 includes a spring member 301 and a housing member 302. The spring member 301 is a canted coil spring that is the same as the spring member 31 and includes first wound portions 311 and second wound portions 312. A plurality of ribs 302a are provided on the housing member 302. The ribs 302a project from a surface on which the spring member 301 is placed in the direction orthogonal to the surface. The widths of the ribs 302a in the right-left direction in FIG. 7 are slightly larger than the pitch of the spring member 301. The spring member 301 is fixed to the housing member 302 in a state where the pitch is enlarged at the positions of the ribs 302a and the spring member 301 sandwiches the ribs 302 between wound portions. It is noted that the ribs may have columnar shapes or prismatic shapes.

Figure 8:
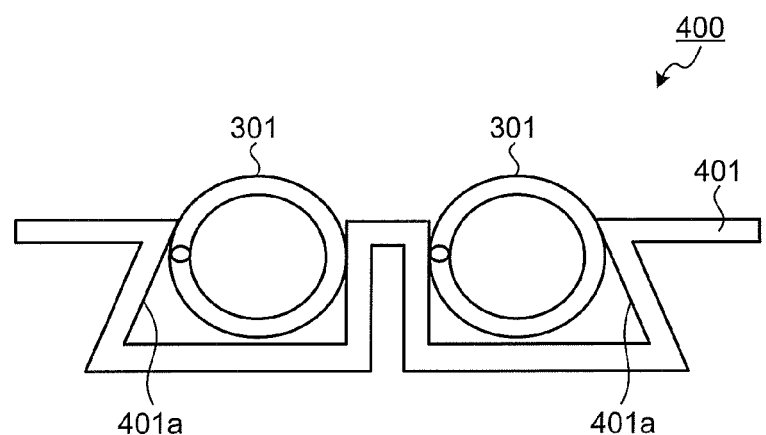
FIG. 8 is a view illustrating a configuration of main parts of a pressure unit according to a fourth modification of the embodiment of the invention.

FIG. 8 is a view illustrating a configuration of a pressure unit according to a fourth modification of the embodiment. A pressure unit 400 as illustrated in FIG. 8 includes the spring members 301 and a housing member 401. The housing member 401 includes groove portions 401a that fix and hold the spring members 301. The groove portions 401a have dovetail shapes having groove widths that become larger toward the bottom surfaces and hold approximately ⅔ portions of the spring members 301.

Figure 9:
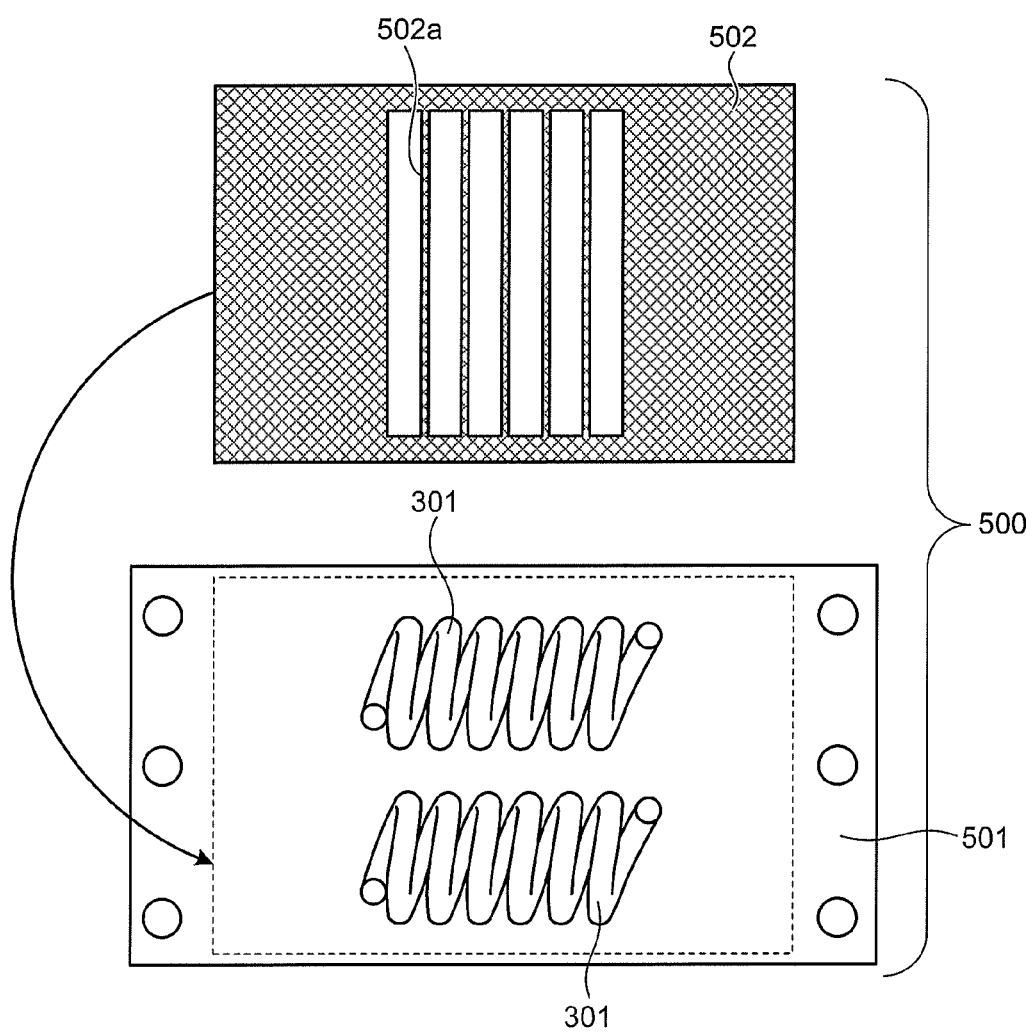
FIG. 9 is a view illustrating a configuration of main parts of a pressure unit according to a fifth modification of the embodiment of the invention.

FIG. 9 is a view illustrating a configuration of main parts of a pressure unit according to a fifth modification of the embodiment. A pressure unit 500 as illustrated in FIG. 9 includes the spring members 301, a housing member 501, and a mesh spring 502. The mesh spring 502 is formed by weaving stainless wire rods into a mesh form. A plurality of hole portions 502a corresponding to the pitch of the spring members 301 are provided on the mesh spring 502. The spring members 301 are placed on a placement surface of the housing member 501, and then, the spring members 301 are inserted through the hole portions 502a. Thereafter, the mesh spring 502 is fixed to the placement surface of the housing member 501. Although there is a method in which four corners are fixed by pins as the method of fixing the mesh spring 502, the method is not limited thereto. According to the fifth modification, the spring members 301 are attached to the housing member 501 with the mesh spring 502 so as to move freely when the spring members 301 deflect in accordance with an external force.

Figure 10:
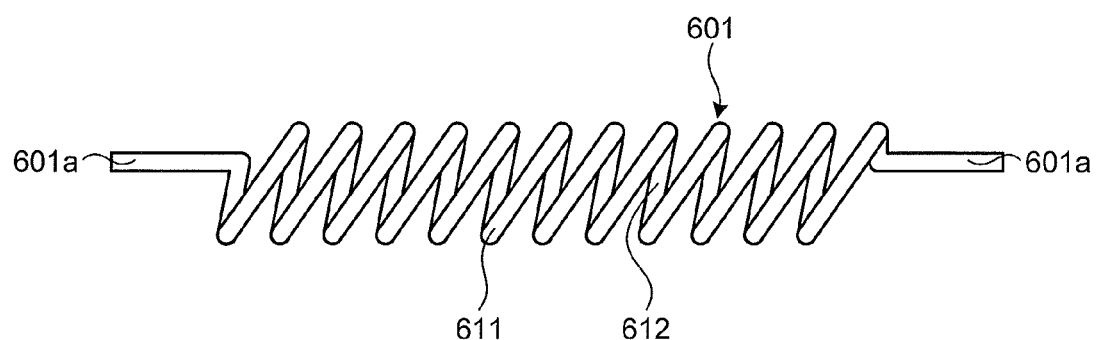
FIG. 10 is a view illustrating a configuration of a spring member constituting a part of a pressure unit according to a sixth modification of the embodiment of the invention.

FIG. 10 is a view illustrating a configuration of a spring member constituting a part of a pressure unit according to a sixth modification of the embodiment. A spring member 601 as illustrated in FIG. 10 includes first wound portions 611 and second wound portions 612, and end portions 601a extending in parallel with the center line of the spring member 601 on both ends. Furthermore, the spring member 601 is a canted coil spring that is the same as the spring member 31 and includes the first wound portions 611 and the second wound portions 612.

Figure 11:
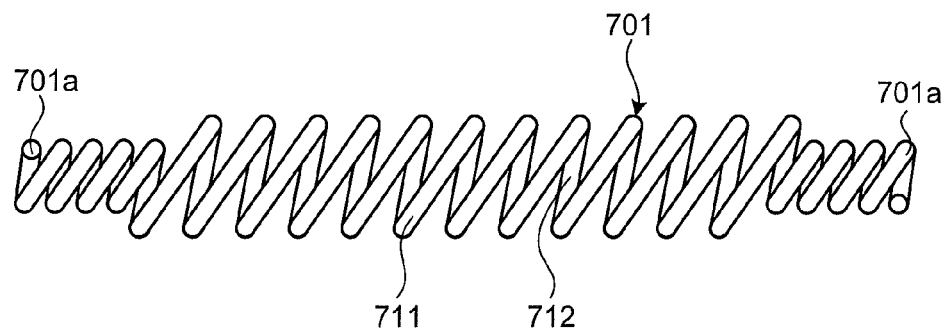
FIG. 11 is a view illustrating a configuration of a spring member constituting a part of a pressure unit according to a seventh modification of the embodiment of the invention.

FIG. 11 is a view illustrating a configuration of a spring member constituting a part of a pressure unit according to a seventh modification of the embodiment. A spring member 701 as illustrated in FIG. 11 is a canted coil spring that is the same as the spring member 31 and includes first wound portions 711 and second wound portions 712. The spring member 701 has end portions 701a wound to have smaller diameter than those of the first wound portions 711 and the second wound portions 712 on both ends.

The spring members 601 and 701 as illustrated in FIG. 10 and FIG. 11, respectively, may be fixed by using the housing member in the same manner as described above or may be attached directly to the housing of the power conversion device.

The same effects as those obtained in the embodiment are obtained by the first to seventh modifications as described above.

In the invention, a non-woven fabric having heat resistance to approximately 150 to 200° C. may be interposed between the spring member and the housing member and the abutting plate. The interposed non-woven fabric can prevent abnormal noise generated between the spring member and the abutting plate and the housing member due to vibration and the like.

Furthermore, in the invention, contact surfaces between the spring member and other members (the housing member, the abutting plate, and the like) may be grinded appropriately.

In addition, in the invention, a wire rod serving as a material of the spring member may have a cross section of a rectangular wire shape or oval shape. The shape of the wire rod can be changed appropriately in accordance with the allowable stress.

REFERENCE SIGNS LIST

1 Power Conversion Device
2 Semiconductor Stacked Unit
3, 100, 200, 300, 400, 500 Pressure Unit
4 Abutting Plate
5 Housing
6 Screw
21 Semiconductor Module
22 Cooling Tube
23 Coupling Pipe
24 Refrigerant Inlet Port
25 Refrigerant Outlet Port
31, 101, 201, 301, 601, 701 Spring Member
32, 102, 202, 302, 401, 501 Housing Member
103 Fixing Member
111, 211, 311, 611, 711 First Wound Portion
112, 212, 312, 612, 712 Second Wound Portion
302a Rib
313 Spring Hook Portion
401a Groove Portion
502 Mesh Spring

The invention claimed is:

1. A pressure unit configured to pressurize a semiconductor stacked unit obtained by alternately stacking a semiconductor element module and a cooling tube that makes contact with the semiconductor element module and cools the semiconductor element module, the pressure unit comprising:
a spring member that is formed into a coil form obtained by winding a wire rod and that has a periodically changing pitch angle; and
a housing member to which the spring member is attached.

2. The pressure unit according to claim 1, wherein
the spring member has hooks on both end portions, and
the housing member has protrusions that project from a surface on which the spring member is placed and are capable of locking the hooks.

3. The pressure unit according to claim 1, wherein
both end portions of the spring member extend in a direction orthogonal to a center line, and
the housing member has hole portions into which both end portions of the spring member are capable of being inserted.

4. The pressure unit according to claim 1, wherein the housing member has a rib that projects from a surface on which the spring member is placed and has a width corresponding to a pitch of a predetermined portion of the spring member.

5. The pressure unit according to claim 1, wherein the housing member has a groove portion that accommodates a part of the spring member.

6. The pressure unit according to claim 1, further comprising a mesh spring that is formed by weaving a steal wire into a mesh form and sandwiches and holds the spring member together with the housing member.

7. The pressure unit according to claim 1, wherein
the spring member is provided in plurality, and
the spring members are attached to the housing member such that center lines of the spring members are parallel with one another.

8. The pressure unit according to claim 1, wherein a non-woven fabric having heat resistance to a predetermined temperature is interposed between the spring member and the housing member.

* * * * *